(12) United States Patent
Xu

(10) Patent No.: US 12,058,876 B2
(45) Date of Patent: Aug. 6, 2024

(54) LAMINATED BATTERY AND METHOD FOR FABRICATION THEREOF

(71) Applicant: LONGI GREEN ENERGY TECHNOLOGY CO., LTD., Shaanxi (CN)

(72) Inventor: Chen Xu, Shaanxi (CN)

(73) Assignee: LONGI GREEN ENERGY TECHNOLOGY CO., LTD., Shaanxi (CN)

( * ) Notice: Subject to any disclaimer, the term of this patent is extended or adjusted under 35 U.S.C. 154(b) by 0 days.

(21) Appl. No.: 18/029,271

(22) PCT Filed: Oct. 9, 2021

(86) PCT No.: PCT/CN2021/122897
§ 371 (c)(1),
(2) Date: Mar. 29, 2023

(87) PCT Pub. No.: WO2022/073518
PCT Pub. Date: Apr. 14, 2022

(65) Prior Publication Data
US 2023/0371292 A1    Nov. 16, 2023

(30) Foreign Application Priority Data

Oct. 9, 2020  (CN) .......................... 202011073513.7

(51) Int. Cl.
*H10K 30/86*   (2023.01)
*H10K 30/10*   (2023.01)
(Continued)

(52) U.S. Cl.
CPC ............. *H10K 30/86* (2023.02); *H10K 30/40* (2023.02); *H10K 30/57* (2023.02); *H10K 30/88* (2023.02);
(Continued)

(58) Field of Classification Search
CPC ........ H10K 30/50; H10K 30/57; H10K 30/86; H10K 85/50; H10K 30/40; H10K 30/88; H10K 71/16; H10K 71/40
See application file for complete search history.

(56) References Cited

FOREIGN PATENT DOCUMENTS

| CN | 110400879 A | 11/2019 |
|---|---|---|
| CN | 110690301 A | 1/2020 |
| CN | 112259686 A | 1/2021 |

OTHER PUBLICATIONS

PCT/CN2021/122897 international search report.

*Primary Examiner* — Lindsey A Buck
(74) *Attorney, Agent, or Firm* — IPro, PLLC

(57) ABSTRACT

A tandem cell and a manufacturing method thereof are provided in the present disclosure, so as to improve hole transmission performance of the tandem cell. The tandem cell includes a bottom cell, a hole transporting layer formed on the bottom cell, a perovskite absorbing layer formed on the hole transporting layer, and a transparent conducting layer formed above the perovskite absorbing layer. A material of the hole transporting layer includes a semiconductor material with a p-type delafossite structure, and a valence band top energy level of the hole transporting layer sequentially decreases in a direction away from the bottom cell, which has dual functions of carrier transport and carrier recombination, so as to simplify a cell structure and optimize the photoelectric conversion efficiency. The tandem cell and the manufacturing method thereof according to the present disclosure are used for manufacturing the tandem cell.

12 Claims, 9 Drawing Sheets

(51) Int. Cl.
  *H10K 30/40* (2023.01)
  *H10K 30/57* (2023.01)
  *H10K 30/88* (2023.01)
  *H10K 71/16* (2023.01)
  *H10K 71/40* (2023.01)
  *H10K 85/50* (2023.01)

(52) U.S. Cl.
  CPC ............. *H10K 71/16* (2023.02); *H10K 71/40* (2023.02); *H10K 85/50* (2023.02); *H10K 30/10* (2023.02)

LAMINATED BATTERY AND METHOD FOR FABRICATION THEREOF

CROSS-REFERENCES TO RELATED APPLICATIONS

The present disclosure claims the priority of the Chinese patent application filed on Oct. 9, 2021 before the China National Intellectual Property Administration with the application number of 202011073513.7 and the title of "LAMINATED BATTERY AND METHOD FOR FABRICATION THEREOF", which is incorporated herein in its entirety by reference.

TECHNICAL FIELD

The present disclosure relates to the technical field of photovoltaics and, more particular, to a tandem cell and a manufacturing method thereof.

BACKGROUND

Organic-inorganic hybrid perovskite solar cells, as a new type of high-efficiency and low-cost solar cells, have been widely concerned all over the world. In just a few years, photoelectric conversion efficiency of perovskite cells has rapidly climbed from 3.8% in 2009 to over 25%, which is close to that of commercial silicon-based solar cells.

In order to further improve conversion efficiency of photovoltaic cells, a plurality of solar cells with different band gaps may be connected in series with a tunneling composite layer. A perovskite solar cell with a wide band gap may be used as a top cell of a tandem cell. When the perovskite solar cell and a bottom cell with a textured structure are stacked together, it has become a key point of the tandem cell to improve hole transport performance of a hole transporting layer and thus improve a filling factor and conversion efficiency of the tandem cell.

SUMMARY

An object of the present disclosure is to provide a tandem cell to improve hole transport performance of the tandem cell.

In a first aspect, a tandem cell is provided in the present disclosure. The tandem cell includes a bottom cell, a hole transporting layer formed on the bottom cell, a perovskite absorbing layer formed on the hole transporting layer, and a transparent conducting layer formed above the perovskite absorbing layer. A material of the hole transporting layer includes a semiconductor material with a p-type delafossite structure, and a valence band top energy level of the hole transporting layer sequentially decreases in a direction away from the bottom cell.

When the technical solution is adopted, a material of the hole transporting layer formed on the bottom cell includes the semiconductor material with the p-type delafossite structure. Meanwhile, in a direction away from the bottom cell, the valence band top energy level of the hole transporting layer sequentially decreases. At this time, a valence band top energy level at a surface of the hole transporting layer close to the bottom cell is close to a conduction band energy level at a surface of the bottom cell, which can replace a p-type heavily doped layer of the tunneling composite layer and form a tunneling composite interface with the n-type heavily doped layer on the bottom cell, thus omitting the tunneling composite layer of the tandem cell, simplifying a process of the tandem cell, reducing process difficulty, and compared with a structure with the tunneling composite layer, reducing contacting interface between the hole transporting layer and the tunneling composite layer and thus interface recombination of carriers. In addition, a gradient energy level of the hole transporting layer facilitates transport of hole carriers, thus improving the photoelectric conversion efficiency of the solar cells.

In some possible implementations, a general chemical formula of the semiconductor material with a p-type delafossite structure is $AB_\alpha C_x$, wherein A includes one or more of $Cu^+$, $Ag^+$, $Pd^+$, $Sr^+$ and $Pt^+$, and B includes one or more of $B^{3+}$, $Al^{3+}$, $Ga^{3+}$, $In^{3+}$, $Cr^{3+}$, $Fe^{3+}$, $Sc^{3+}$ and trivalent rare earth cations; $\alpha$ ranges from 0.9 to 1.1, C is an oxygen group element, including one or more of O, S, Se and Te, x ranges from 1.95 to 2.6, and a ranges from 0.9 to 1.1.

When the technical solution is adopted, polarizability of A ions is close to that of halogen ions in a perovskite material forming the perovskite absorbing layer, thus having strong coordination force, reducing interface contact defects between the hole transporting layer and the perovskite absorbing layer, improving interface contact performance, and further improving hole transport capacity and photoelectric conversion efficiency of the tandem cell.

In some possible implementations, a content of the element B in the hole transporting layer increases sequentially in a direction from a part of the hole transport further from the perovskite absorbing layer to a part of the hole transport closer to the perovskite absorbing layer; and the valence band top energy level of the hole transporting layer sequentially decreasing.

In some possible implementations, a thickness of the hole transporting layer is from 5 nm to 100 nm.

In some possible implementations, the valence band top energy level of the hole transporting layer ranges from −4.5 eV to −5.4 eV.

In some possible implementations, a top layer of the bottom cell is an n-type heavily doped layer. The n-type heavily doped layer contacts with the hole transporting layer to form a carrier composite interface. The bottom cell may be an n-type cell or a p-type cell. At this time, on the one hand, the n-type heavily doped layer, together with a passivation layer and the bottom cell below the n-type heavily doped layer, form a passive cell structure, which can passivate contacts, reduce adverse recombination of carriers and improve the photoelectric conversion efficiency of the bottom cell. On the other hand, a tunneling recombination interface is formed by the n-type heavily doped layer and a surface of the hole transporting layer close to the bottom cell, thus realizing tunneling recombination of carriers between the bottom cell and the top cell.

In some possible implementations, the tandem cell further includes a passivation layer between the bottom cell and the n-type heavily doped layer. At this time, the passivation layer can function well in passivating the bottom cell and inhibit adverse carrier recombination.

In some possible implementations, the bottom cell may be any one of a crystalline silicon bottom cell, a polycrystalline silicon bottom cell, an ingot monocrystalline silicon bottom cell, a copper indium gallium selenide bottom cell, a perovskite bottom cell, a gallium arsenide bottom cell and an organic photovoltaic bottom cell.

When the technical solution is adopted, since both the hole transporting layer and the perovskite absorbing layer have adjustable band gaps, they may be matched with currents of the plurality of bottom cells described above, thereby obtaining a tandem cell with high conversion efficiency.

In a second aspect, a manufacturing method of a tandem cell is provided in the present disclosure. The manufacturing method of the tandem cell includes following steps:

providing a bottom cell;

forming a hole transporting layer on the bottom cell by a vacuum deposition process, a material of the hole transporting layer including a semiconductor material with a p-type delafossite structure, and a valence band top energy level of the hole transporting layer sequentially decreasing in a direction away from the bottom cell;

forming a perovskite absorbing layer on the hole transporting layer; and forming an electron transporting layer and a transparent conducting layer on the perovskite absorbing layer.

In some possible implementations, the vacuum deposition process is a magnetron sputtering process, a laser pulse deposition process or a thermal evaporation coating process.

In some possible implementations, forming the perovskite absorbing layer on the hole transporting layer includes:

forming lead iodide and cesium bromide on the hole transporting layer by co-evaporation;

coating a mixed solution of formamidine hydroiodide and formamidine hydrobromide on lead iodide and cesium bromide to form a perovskite film.

The perovskite film is annealed to form the perovskite absorbing layer.

Beneficial effects of the manufacturing method of the tandem cell according to the second aspect or any possible implementation of the second aspect can refer to beneficial effects of the tandem cell according to the first aspect or any possible implementation of the first aspect, which will not be described repeatedly herein again.

BRIEF DESCRIPTION OF THE DRAWINGS

The figures described here are used to provide a further understanding of the application and constitute a part of the present application. The indicative embodiments and their explanations of the present application are used to explain the present application, which does not constitute an improper limitation of the present application. In the figures.

ELEMENTS AND REFERENCE NUMBERS

Figure 1:
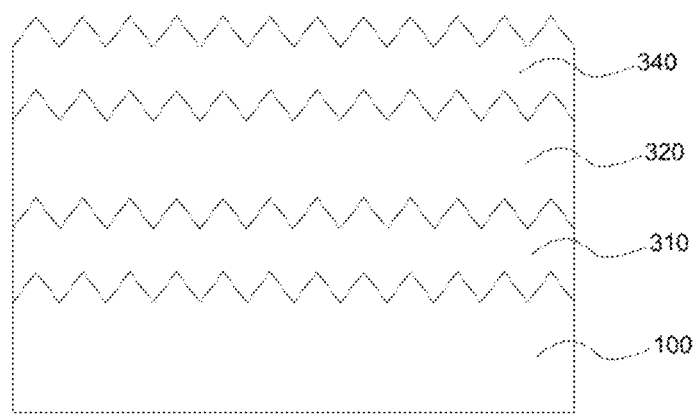
FIG. 1 is a schematic structural diagram of a tandem cell according to an embodiment of the present disclosure.

100—bottom cell, 101—n-type monocrystalline silicon substrate, 102—first passivation layer, 103—second passivation layer, 104—n-type doped layer, 105—p-type doped layer, 106—first transparent conducting layer, 210—passivation layer, 220—n-heavily doped layer, 310—hole transport layer, 320—perovskite absorbing layer, 331—electron transporting interface layer, 332—leakage repairing layer, 333—electron transporting layer, 340—transparent conducting layer, 341—second transparent conducting layer, 400—electrode.

DETAILED DESCRIPTION OF THE EMBODIMENTS

In order to facilitate a clear description of the technical solution of the embodiments of the present application, in the embodiments of the present application, the words "first" and "second" etc. are used to distinguish the same items or similar items with basically the same functions and roles. A person skilled in the art can understand that the words "first" and "second" etc. do not limit the number and execution order, and the words "first" and "second" etc. are not limited to that they must be different.

In the description of the present application, it is necessary to understand that the orientation or positional relationship indicated by the terms "up", "down", "front", "back", "left", "right", etc. is based on the orientation or positional relationship shown in the figures. It is only to facilitate the description and simplify the description of the present application, rather than to indicate or imply that the device or component referred to must have a specific orientation, be constructed and operated in a specific orientation, so it cannot be understood as a limitation on the present application.

It should be noted that, in the present application, the words "illustrative" or "for example" etc. are used to mean giving examples, illustration or explanations. Any embodiment or designing solution described as "exemplar" or "for example" in the present application should not be interpreted as being more preferred or advantageous than other embodiments or designing solutions. Specifically, the use of words such as "exemplar" or "for example" etc. aims to present relevant concepts in a specific way.

In the present disclosure, "at least one" refers to one or more, and "multiple" refers to two or more. An expression "and/or" which describes a relationship of related objects means that there may be three relationships, for example, an expression "A and/or B" can refer to A alone, A and B, and B alone, where A and B may be in a singular or plural form. A character "/" generally indicates an "or" relationship for contextual objects. An expression "at least one of following ones (items)" or its similar expression refers to any combination of these items, including any combination of single one (item) or plural items (ones). For example, at least one of a, b or c can refer to: a, b, c, combination of a and b, combination of a and c, combination of b and c, or combination of a, b and c, where a, b and c may be in a singular or plural form.

At present, crystalline silicon cells, as a mainstream product in photovoltaic field, involve high-efficiency crystalline silicon photovoltaic cell technologies, with a cell efficiency (26.7%) close to its theoretical limit efficiency (29.4%). With continuous development of photovoltaic technologies, tandem cell technologies have been proved to be an effective way to break through an efficiency of a traditional crystalline silicon photovoltaic cell.

Organic-inorganic hybrid perovskite solar cells, as a new type of high-efficiency and low-cost solar cells, have been widely concerned all over the world. In just a few years, photoelectric conversion efficiency of perovskite cells has rapidly climbed from 3.8% in 2009 to over 25%, which is close to the efficiency of commercial silicon-based solar cells. The perovskite cell can adjust an absorption band gap of the perovskite cell ranging from 1.5 eV to 1.8 eV by adjusting composition formula, so that the perovskite cell may be an ideal tandem top cell. A crystalline silicon-perovskite tandem cell combined by the perovskite cell and the crystalline silicon cell is expected to achieve a photoelectric conversion efficiency of more than 30%. At present, it has been shown in documents that the conversion efficiency of the crystalline silicon-perovskite tandem cell can reach more than 25%.

The crystalline silicon-perovskite tandem cell uses the crystalline silicon cell as the bottom cell to absorb energy of sunlight with a wavelength of 800 nm-1200 nm, and uses the perovskite cell as the top cell to absorb energy of sunlight with a wavelength of 300 nm-800 nm. The bottom cell and the top cell are connected through the tunneling composite layer to form cells with two ends connected in series, and an overall open circuit voltage of the tandem cell is superposition of open circuit voltages of the top cell and the bottom cell.

Internal series connection between the bottom cell and the top cell needs to meet two conditions of reducing optical absorption and ohmic contact at the same time. In related art, a tunneling junction is generally disposed between the top cell and the bottom cell to enhance recombination of carriers, but a thickness, a growth quality and an impurity diffusion of the tunneling junction may greatly affect performance of the tunneling junction, with a harsh preparation condition. In addition, when the hole transporting layer of the top perovskite solar cell is made of organic materials, compatibility of the hole transporting layer with the tunneling junction and the perovskite layer is poor, and it is difficult to form a perovskite film with good crystallinity, which affects a filling factor and a conversion efficiency of the tandem cell.

In order to solve above technical problems, a tandem cell is further provided in an embodiment of The present disclosure. The tandem cell is not only suitable for a tandem cell with the crystalline silicon cell as the bottom cell, but also suitable for a tandem cell with any one of a polycrystalline silicon cell, an ingot monocrystalline silicon cell, a copper indium gallium selenide cell, a perovskite cell, a gallium arsenide cell and an organic photovoltaic cell as the bottom cell, which is not limited herein.

As shown in FIG. 1, the tandem cell according to an embodiment of the present disclosure includes a stacked bottom cell 100, a hole transporting layer 310, a perovskite absorbing layer 320 and a transparent conducting layer 340.

The bottom cell 100 has a textured surface. The bottom cell 100 may be any of the bottom cell 100 described above, which is not limited herein. The textured surface may be a pyramid-shaped textured surface or an inverted pyramid-shaped textured surface.

A passivation layer 210 may be formed on the bottom cell 100. A material of the passivation layer 210 includes silicon dioxide or the like. At this time, the passivation layer 210 may better play a role in passivating the bottom cell 100 and restraining adverse carrier recombination. In practical applications, the passivation layer 210 can also be omitted.

A top layer of the bottom cell 100 is an n-type heavily doped layer 220, which is located on the passivation layer 210 and is in contact with a hole transporting layer 310 described below. The n-type heavily doped layer 220 contacts with the hole transporting layer 310 to form a carrier recombination interface. The bottom cell 100 may be an n-type cell or a p-type cell. At this time, on the one hand, the n-type heavily doped layer 220, together with a passivation layer 210 and the bottom cell 100 below the n-type heavily doped layer 220, form a passive cell structure, which can passivate contacts, reduce adverse recombination of carriers and improve the photoelectric conversion efficiency of the bottom cell 100. On the other hand, a tunneling recombination interface is formed by the n-type heavily doped layer 220 and a surface of the hole transporting layer 310 close to the bottom cell 100, thus realizing tunneling recombination of carriers between the bottom cell 100 and the top cell. Specifically, the n-type heavily doped layer may be a microcrystalline silicon layer doped with a VA group atom such as phosphorus, arsenic, antimony and bismuth atom.

The hole transporting layer 310 is formed on the n-type heavily doped layer 220, and a valence band top energy level of the hole transporting layer 310 sequentially decreases in a direction away from the bottom cell 100. The valence band top energy level of the hole transporting layer 310 ranges from −4.5 eV to −5.4 eV.

In practical applications, a content of the element B in the hole transporting layer increases sequentially in a direction from a part of the hole transport further from the perovskite absorbing layer to a part of the hole transport closer to the perovskite absorbing layer; and the valence band top energy level of the hole transporting layer sequentially decreasing.

Specifically, elements contained in the hole transporting layer, as well as distribution and chemical ratio of the elements contained in the hole transporting layer, may be adjusted so as to fabricate the hole transporting layer with a sequentially decreasing valence band top energy level.

For example, in fabricating the hole transporting layer, specific elements of A, B and C in the semiconductor material $AB_\alpha C_x$ with a p-type delafossite structure and values of a and x may be selected according to actual situations. Of course, it is also possible to control distribution of materials during a fabrication process, so as to fabricate the hole transporting layer with the sequentially decreasing valence band top energy level.

Specifically, three sub-layers of p-type delafossite films are deposited by sputtering, and each of the sub-layers uses a p-type delafossite target with different B contents. For example, a first sub-layer uses a target with a composition of $AB_{0.9}O_2$, a second sub-layer uses a target with a composition of $ABO_2$, and a third sub-layer uses a target with a composition of $AB_{1.1}O_2$. The first sub-layer is a first sub-layer in a direction away from the bottom cell and the second sub-layer is arranged on the first sub-layer in the direction away from the bottom cell. The third sub-layer is arranged on the second sub-layer in the direction away from the bottom cell, that is, B contents in the sub-layers increase sequentially in a direction from a layer further from the perovskite absorbing layer to a layer closer to the perovskite absorbing layer.

A material of the hole transporting layer 310 includes a semiconductor material with a p-type delafossite structure, and the perovskite absorbing layer 320 is formed on the hole transporting layer 310, and the perovskite absorbing layer 320 may be made of a semiconductor material with a perovskite structure.

In terms of the hole transporting layer 310 formed on the bottom cell 100, a material of the hole transporting layer 310 includes a semiconductor material with a p-type delafossite structure. At this time, from the perovskite absorbing layer 320 to the hole transporting layer 310 and to the bottom cell 100, energy levels between the three films sequentially vary, so that hole transport barrier may be reduced, charge loss may be reduced, and the hole transporting performance and the filling factor of the tandem cell may be further improved.

Meanwhile, in a direction away from the bottom cell 100, the valence band top energy level of the hole transporting layer 310 sequentially decreases. At this time, a valence band top energy level at a surface of the hole transporting layer 310 close to the bottom cell 100 is close to a conduction band energy level at a surface of the bottom cell 100, which can form a tunneling composite interface with the n-type heavily doped layer 220 on the bottom cell 100, thus omitting the tunneling composite layer of the tandem cell, simplifying a process of the tandem cell, reducing process difficulty. In addition, the energy band structure of the hole transporting layer 310 sequentially varies, which facilitate to driving transporting of hole carriers.

In addition, because the semiconductor material with the p-type delafossite structure is an inorganic semiconductor material, the hole transporting layer 310 made of the semiconductor material with the p-type delafossite structure have good compatibility with and adaptability to the n-type heavily doped layer 220 made of an inorganic material, which can improve various performance parameters and photoelectric conversion efficiency of the tandem cell. Moreover, compared with the hole transporting materials such as Spiro-OMeTAD or PTAA, which are expensive, complicated in synthesis and have poor stability after introducing dopants, manufacturing methods of the semiconductor material with the p-type delafossite structure are mature and low prices, which can greatly reduce manufacturing cost of the tandem cell.

The semiconductor material with the p-type delafossite structure is a p-type semiconductor material with high mobility. A general chemical formula of the semiconductor material with the p-type delafossite structure is $AB_\alpha C_x$, wherein A is a monovalent soft acid cation, B is a trivalent cation and C is an oxygen group element. $\alpha$ ranges from 0.9 to 1.1 and x ranges from 1.95 to 2.6. For example, a may be 0.9, 1.0, 1.1; and x may be 1.95, 2.0, 2.05, 2.1, 2.14, 2.3, 2.4, 2.5 or 2.6. A general chemical formula of the semiconductor material with a perovskite structure is $SDY_3$. S is a monovalent organic cation, D is a divalent soft acid cation, and Y is a monovalent soft base anion.

According to an principle of easy and stable combination of soft acids and soft bases, on the one hand, there is a strong interaction force between Y ions contained in the perovskite absorbing layer 320 and A ions contained in the hole transporting layer 310, so that the hole transporting layer 310 containing A ions can induce crystal growth of perovskite materials thereon, and then it is easy to form the perovskite absorbing layer 320 with higher order and crystallinity, thus improving the photoelectric conversion efficiency. Meanwhile, at an interface between the hole transporting layer 310 and the perovskite absorbing layer 320, a soft acid cation of the semiconductor material with the p-type delafossite structure may perform soft-acid-soft-base coordinating with a Y ion (soft alkali ion) of the perovskite material, so that interface defects of the perovskite absorbing layer 320 may be passivated, carrier recombination of the tandem cell may be reduced, and the photoelectric conversion efficiency may be improved. In addition, due to a soft-acid-soft-base coordination force between the A ions and the Y ions in the perovskite absorbing layer 320, lattice matching at a contact interface between the hole transporting layer 310 and the perovskite absorbing layer 320 is high, so that hole extraction performance of the hole transporting layer 310 may be improved. On the other hand, there also is a strong interaction force between the Y ion contained in the perovskite absorbing layer 320 and the soft acid cation D, so that soft-acid-soft-base coordinating may be performed, so that a thin film with high crystallinity may be formed by the force between the two, and performance of the perovskite absorbing layer 320 to absorb sunlight and generate carriers may be improved, thereby improving the photoelectric conversion efficiency of the tandem cell.

In the semiconductor material with the p-type delafossite structure described above, A may include one or more of $Cu^+$, $Ag^+$, $Pd^+$, $Sr^+$ and $Pt^+$, which often exists in a monovalent state. B may include one or more of $B^{3+}$, $Al^{3+}$, $Ga^{3+}$, $In^{3+}$, $Cr^{3+}$, $Fe^{3+}$, $Sc^{3+}$ and trivalent rare earth cations, which often exists in trivalent state, and a ranges from 0.9 to 1.1. C is an oxygen group element, including one or more of O, S, Se and Te, and x ranges from 1.95 to 2.6. Polarizability of these A ions is close to polarizability of Y ions in the perovskite material forming the perovskite absorbing layer 320, thus having strong coordination force, and further improving hole transporting capacity and photoelectric conversion efficiency of the tandem cell.

Figures 2A, 2B:
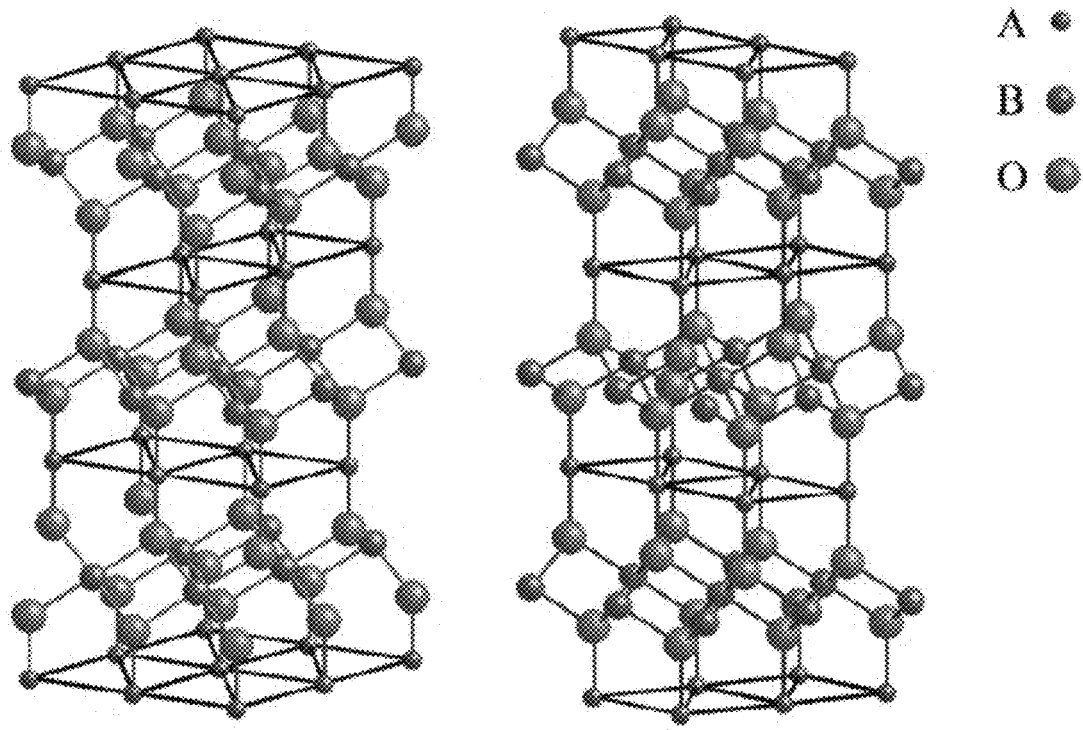
FIGS. 2a and 2b are schematic diagrams of crystal structures of a semiconductor material with a p-type delafossite structure according to an embodiment of the present disclosure, wherein a is the first crystal structure of the semiconductor material with the p-type delafossite structure, and b is the second crystal structure of the semiconductor material with the p-type delafossite structure.

A space group for the crystal structure of the semiconductor material with the p-type delafossite structure is R3m (space group NO. 166). As shown in FIG. 2a and FIG. 2b, when C is O element and x is 2, in its crystal structure, one B atom can form edge-sharing octa-coordination of $BO_6$ with six O atoms, and one A atom is linearly coordinated with two O atoms in an adjacent $BO_6$ layer, respectively, and A atoms constitute an A atom layer. The A atom layer and the $BO_6$ layer form an alternating crystal structure and are stacked through O-A-O ionic bonds. In the octacoordinated $BO_6$ structure, an ionic radius of the B atom may be varied in a range of 0.5 Å to 1 Å. It can be seen that the p-type delafossite structure has broad tolerance for B atoms, that is, there's a wide choice space for the B atoms. In view of different ionic radii of B atoms, optical, electrical and magnetic properties of the semiconductor material with the p-type delafossite structure are different, so that the optical, electrical and magnetic properties of the semiconductor material with the p-type delafossite structure may be regulated in a wide range. At this time, a band gap of the hole transporting layer 310 may be adjusted in a range from 1.3 eV to 3.5 eV through regulation in composition. Meanwhile, the band gap of the hole transporting layer 310 may be adjusted to be different from the band gaps of the perovskite absorbing layer 320 and the bottom cell 100, thereby avoiding absorption of solar energy in an absorptive band of the tandem cell by the hole transporting layer 310.

Taking $AgGaO_2$ as an example, its band gap is 3.1 eV, its valence band top energy level is −5.20 eV and its conduction band bottom energy level is −2.10 eV. On the one hand, the valence band top energy level of $AgGaO_2$ is close to a HOMO energy level (about −5.30 eV) of the perovskite absorbing layer 320, which facilitates collection of hole charges; on the other hand, its conduction band low energy level is far from a LUMO energy level (about −3.90 eV) of the perovskite absorbing layer 320, which can effectively block diffusion of electrons.

The hole transporting layer 310 may be doped with a metal or nonmetal element. The metal element may be Mg, and the nonmetal element may be N. At this time, a band gap width of the hole transporting layer 310 may be adjusted by a method of doping, which fabricates it easier for the hole transporting layer 310 to match the energy levels of the n-type heavily doped layer 220 and the perovskite absorbing layer 320.

For example, one or more of Mg, Ga and Sr may be doped in the semiconductor material with the p-type delafossite structure for fabricating the hole transporting layer 310. At this time, due to doping of the metal elements, the valence band top energy level of the hole transporting layer 310 varies slightly. For example, when Ga is doped in $CuCrO_2$, a material for fabricating the hole transporting layer 310, the valence band top energy level of the hole transporting layer 310 may decrease by 0.05 eV.

The hole transporting layer 310 may be formed on the n-type heavily doped layer 220 by a vacuum deposition process. The formed hole transporting layer 310 has a thickness from 5 nm to 100 nm. For example, a thickness of the hole transporting layer 310 may be 5 nm, 18 nm, 20 nm, 30 nm, 40 nm, 47 nm, 50 nm, 60 nm, 70 nm, 77 nm, 85 nm, 90 nm, 95 nm or 100 nm, etc.

When the hole transporting layer 310 is formed of the semiconductor material with the p-type delafossite structure by vacuum deposition, pollution of impurities to the semiconductor material with the p-type delafossite structure may be reduced, and then the hole transporting layer 310 with high crystallinity, high purity, good compactness and good bonding strength may be formed, thereby further improving a hole transporting efficiency of the hole transporting layer 310 and its bonding performance with the n-type heavily doped layer 220, and increasing the filling factor and photoelectric conversion efficiency of the tandem cell.

In the semiconductor material $SDY_3$ with a perovskite structure contained in the perovskite absorbing layer 320, S is one or more of $CH_3NH_3$ cation, $C_4H_9NH_3$ cation, $NH_2=CHNH_2$ cation and Cs cation; D is one of or a combination of two of $Pb^{2+}$ and $Sn^{2+}$; Y is one or more of $I^-$, $Cl^-$ and $Br^-$. The perovskite absorbing layer 320 may be fabricated by firstly co-evaporating to form a cation anchoring layer, and then spin-coating an anion salt and then annealing.

The transparent conducting layer 340 is formed above the perovskite absorbing layer 320. Of course, an electron transporting layer 333 may be included between the perovskite absorbing layer 320 and the transparent conducting layer 340, and an electrode 400 is further formed on the transparent conducting layer 340 and the bottom cell 100.

Figure 3:
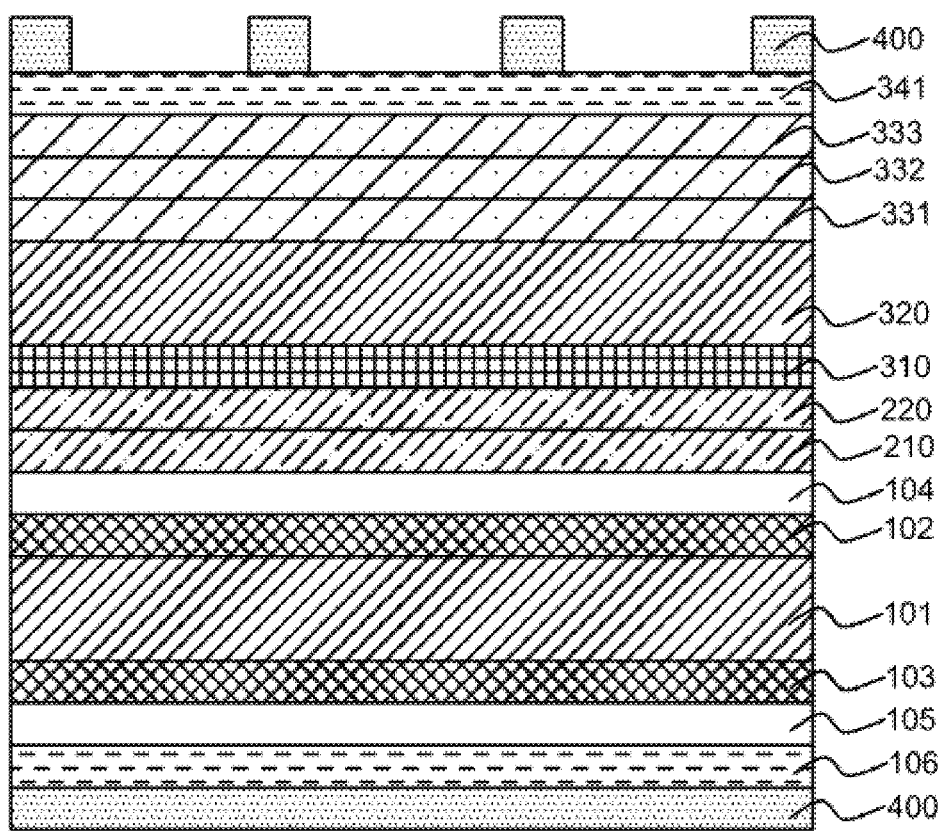
FIG. 3 is a schematic structural diagram of an n-type silicon heterojunction-perovskite tandem cell according to an embodiment of the present disclosure.

A manufacturing method of a tandem cell is further provided in an embodiment of the present disclosure. Taking manufacturing of the n-type silicon heterojunction-perovskite tandem cell shown in FIG. 3 as an example, the manufacturing method is as follows.

Figure 4:
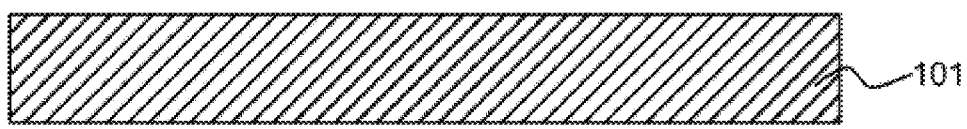
FIG. 4 to FIG. 16 are schematic diagrams of various stages of a manufacturing process of the n-type silicon heterojunction-perovskite tandem cell according to an embodiment of the present disclosure.

As shown in FIG. 4, an n-type crystalline silicon wafer is provided. The n-type crystalline silicon wafer may be a commercial M2 silicon wafer with resistivity of 1 Ω·cm to 10 Ω·cm and a thickness from 50 μm to 200 μm. The n-type crystalline silicon wafer is polished, textured and cleaned in turn to form the n-type monocrystalline silicon substrate 101 with a textured surface.

Figure 5:
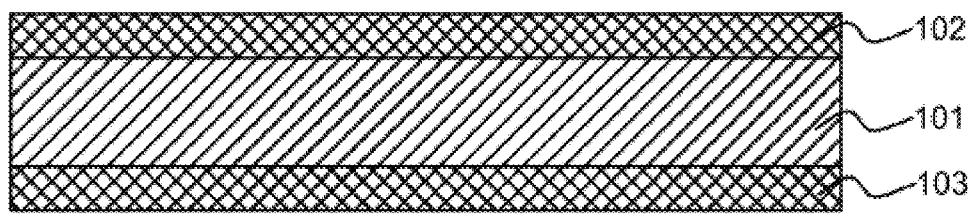

As shown in FIG. 5, an intrinsic amorphous silicon passivation layer is deposited on both sides of the n-type monocrystalline silicon substrate 101 to form a first passivation layer 102 on a front face of the n-type monocrystalline silicon substrate 101 and a second passivation layer 103 on a back face of the n-type monocrystalline silicon substrate 101. In practical applications, a plasma chemical vapor deposition (PECVD) process, a hot filament chemical vapor deposition process or a catalytic chemical vapor deposition process may be used to fabricate the intrinsic amorphous silicon passivation layer. A thickness of the intrinsic amorphous silicon passivation layer may be from 1 nm to 20 nm.

Figure 6:
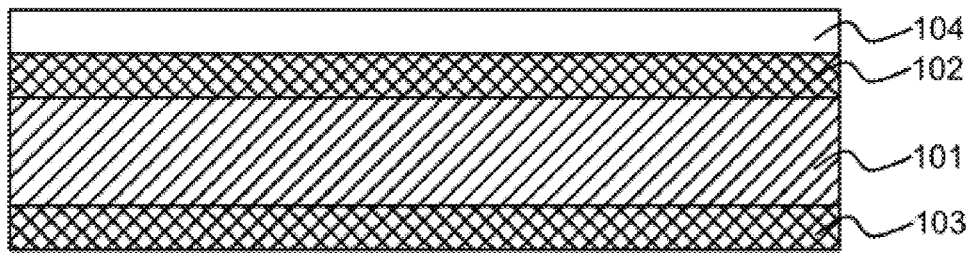

As shown in FIG. 6, an n-type doped layer 104 is deposited on the first passivation layer 102 to form a front field structure. The n-type doped layer 104 is made of amorphous silicon or microcrystalline silicon. In practical applications, the n-type doped layer 104 may be fabricated by a PECVD process, a hot filament chemical vapor deposition process or a catalytic chemical vapor deposition process. A thickness of the n-type doped layer 104 may be from 1 nm to 30 nm.

Figure 7:
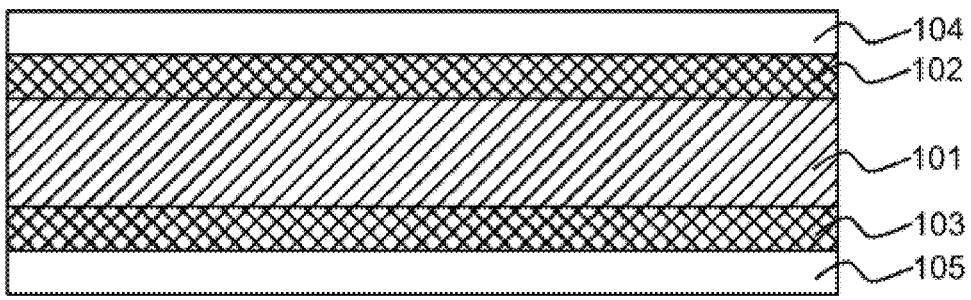

As shown in FIG. 7, a p-type doped layer 105 is deposited on the second passivation layer 103 to form a back emitter. The p-type doped layer is made of amorphous silicon or microcrystalline silicon. In practical applications, the p-type doped layer 105 may be made by a PECVD process, a hot filament chemical vapor deposition process or a catalytic chemical vapor deposition process. A thickness of the p-type doped layer 105 may be from 1 nm to 30 nm.

Figure 8:
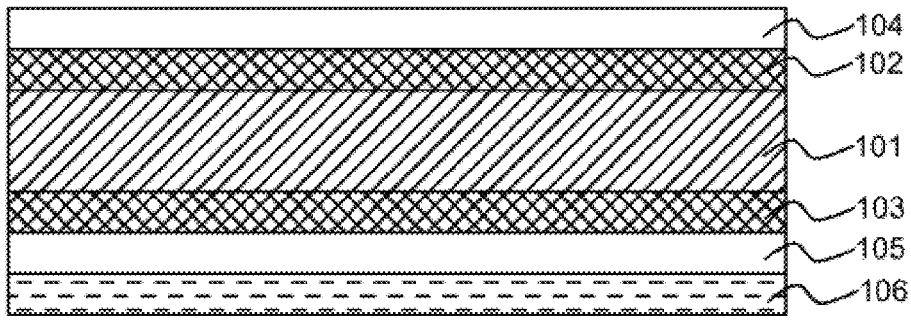

As shown in FIG. 8, a first transparent conducting layer 106 is formed on the p-type doped layer 105 to realize collection and transmission of photo-generated carriers. In practical applications, the first transparent conducting layer 106 may be manufactured by a magnetron sputtering process. Specifically, a material of the first transparent conducting layer 106 may be one or more of indium tin oxide (ITO), tungsten-doped indium oxide ($In_2O_3$: W, abbreviated as IWO), indium zinc oxide (IZO) and titanium-doped indium oxide thin film (ITiO). A thickness of the first transparent conducting layer 106 may be from 30 nm to 120 nm. The obtained structure is defined as the bottom cell 100, which has a textured surface.

It should be understood that as a starting step of the tandem cell, the cell may be fabricated by providing an n-type crystalline silicon wafer as a process starting point, or the tandem cell may be fabricated by taking the bottom cell 100 defined in the present disclosure as the process starting point.

Figure 9:
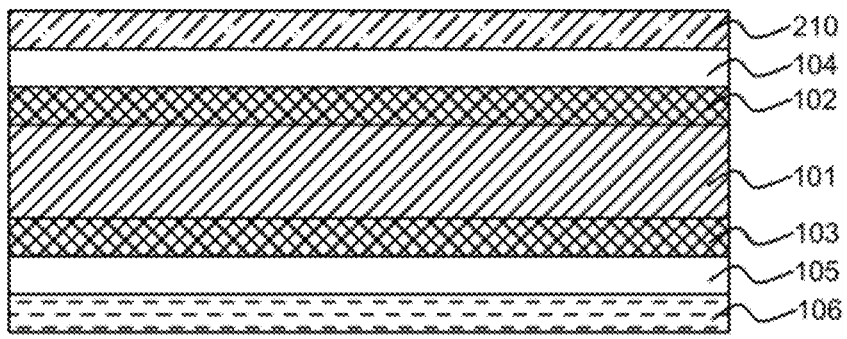

As shown in FIG. 9, a passivation layer 210 is formed on the n-type doped layer 104 to realize contact passivation. In practical applications, the passivation layer 210 may be fabricated by magnetron sputtering, chemical vapor deposition and other processes.

Figure 10:
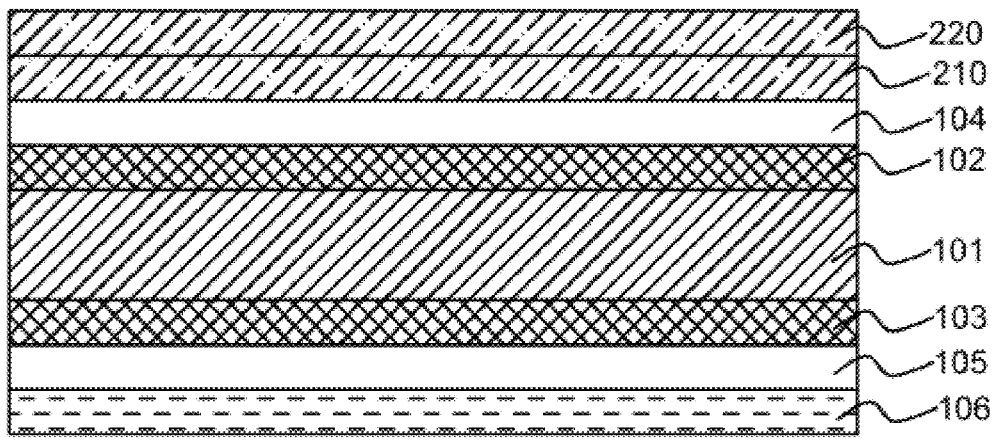

As shown in FIG. 10, an n-type heavily doped layer 220 is formed on the silicon passivation layer 210. The n-type heavily doped layer and a surface of the hole transporting layer 310 close to the bottom cell 100 below constitute a tunneling composite interface to realize tunneling composite collection of photo-generated carriers. Illustratively, the n-type heavily doped layer 220 may be a phosphorus-doped microcrystalline silicon thin film. The n-type doped layer 220 may be fabricated by a PECVD process, a hot filament chemical vapor deposition process or a catalytic chemical vapor deposition process.

Figure 11:
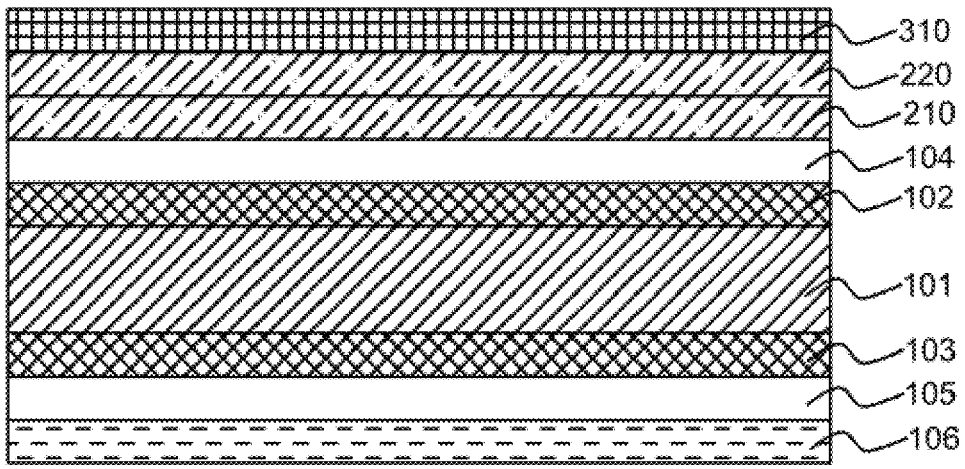

As shown in FIG. 11, a hole transporting layer 310 of the semiconductor material with the p-type delafossite structure is formed on the n-type heavily doped layer 220. In a direction away from the bottom cell 100, the valence band top energy level of the hole transporting layer 310 sequentially decreases, with a variation range of the valence band top energy level from −4.5 eV to −5.4 eV. In practical applications, the hole transporting layer 310 may be manufactured by a vacuum deposition process. Specifically, the vacuum deposition process may be a magnetron sputtering process, a laser pulse deposition process or a thermal evaporation coating process.

For example, when the hole transporting layer 310 is manufactured by the magnetron sputtering process, a hole transporting layer with a thickness from 5 nm to 100 nm is formed.

Figure 12:
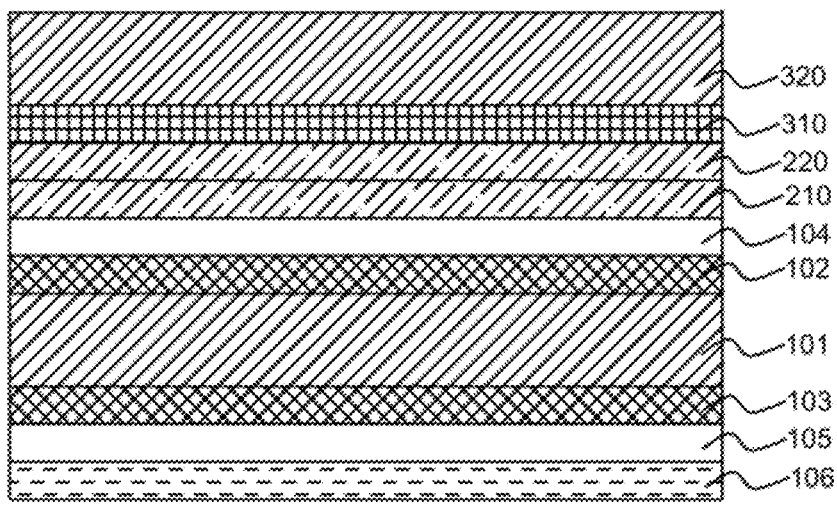

As shown in FIG. 12, a perovskite absorbing layer 320 is formed on the hole transporting layer 310. Specifically, Lead iodide and cesium bromide are formed on the hole transporting layer 310 by co-evaporation, with a total thickness of 250 nm-1000 nm.

A mixed solution of formamidine hydroiodide (FAI) and formamidine hydrobromide (FABr) is coated on lead iodide and cesium bromide, and the mixed solution of FAI and FABr may be reacted with lead iodide and cesium bromide to form a perovskite material film. A molar concentration ratio of FAI and FABr may be (2-4):1, and a solvent of the mixed solution of FAI and FABr may be ethanol or isopropanol.

The perovskite material thin film is annealed to form the perovskite absorbing layer 320. An annealing temperature may be from 100° C. to 200° C., with annealing time from 5 min to 30 min, and a thickness of the perovskite absorbing layer 320 may be from 100 nm to 1000 nm. A material composition of the perovskite absorbing layer 320 is $Cs_xFA_{1-x}Pb(Br_yI_{1-y})_3$.

When the perovskite absorbing layer 320 is fabricated by the above methods, the cationic salt quickly reacts with underlying lead iodide to form the perovskite thin film and excessive unreacted cationic salt solution is thrown off a processing interface with a spin coating process, thus avoiding accumulation at a valley bottom of the pyramid-shaped textured surface, so that a uniform perovskite thin film may be conformally deposited on the textured surface.

Figure 13:
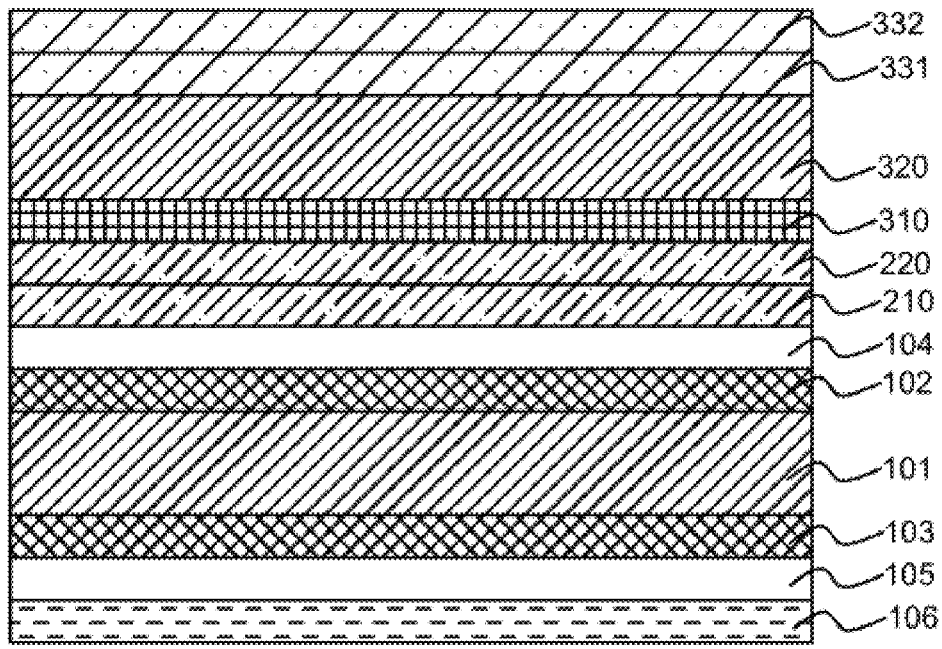

As shown in FIG. 13, an electron transporting interface layer 331 and a leakage repairing layer 332 are sequentially formed on the perovskite absorbing layer 320. In practical applications, the electron transporting interface layer 331 may be a LiF thin film layer, and the leakage repairing layer 332 may be a C60 or fullerene derivative (PCBM) thin film layer. The LiF thin film layer and C60 thin film layer may be fabricated by thermal evaporation, a thickness of the electron transporting interface layer 331 may be from 0.1 nm to 10 nm, and a thickness of the leakage repairing layer 332 may be from 1 nm to 20 nm. In practical applications, one or both of the electron transporting interface layer 331 and the leakage repairing layer 332 may be omitted.

Figure 14:
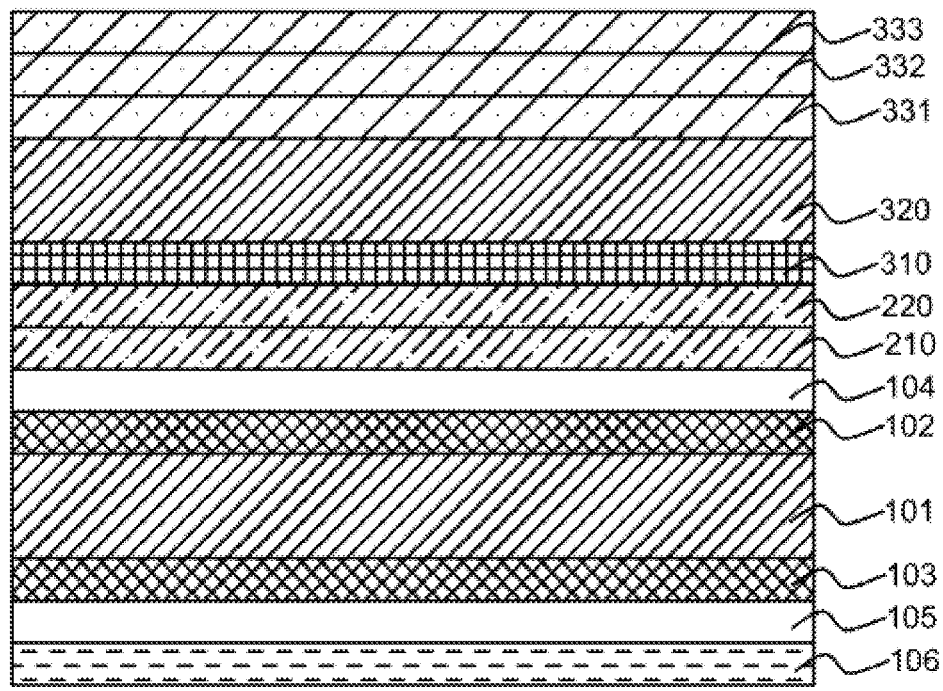

As shown in FIG. 14, an electron transporting layer 333 is formed on the electron transporting interface layer 331. In practical applications, the electron transporting layer 333 may be made of $SnO_2$ with a layer thickness from 1 nm to 30 nm, and its manufacturing process may be any one of atomic layer deposition (ALD) process, chemical vapor deposition process, physical vapor deposition process and solution coating process.

Figure 15:
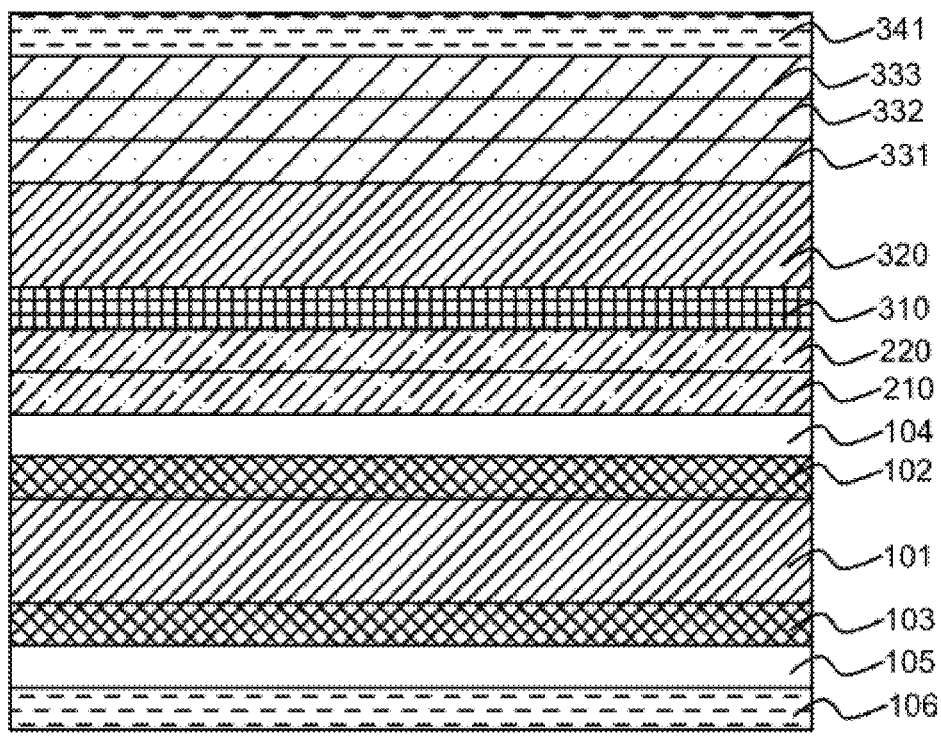

As shown in FIG. 15, a second transparent conducting layer 341 is formed on the electron transporting layer 333 to collect photo-generated carriers. A material, a thickness and a formation process of the second transparent conducting layer 341 may refer to the first transparent conducting layer 106.

Figure 16:
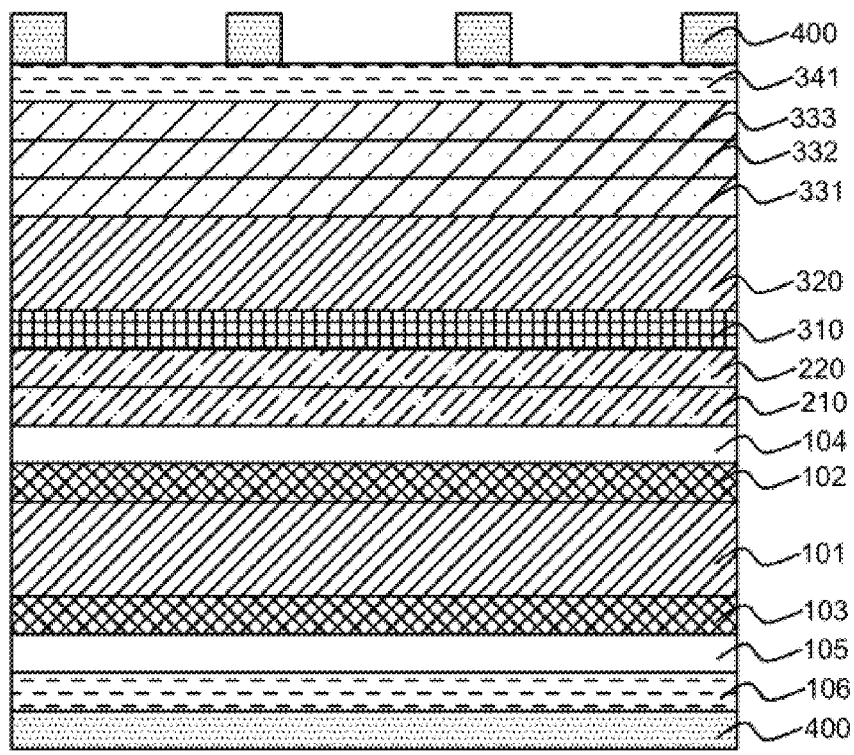
Figure 17A:
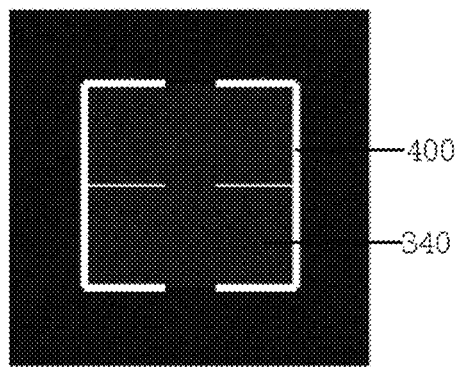
FIG. 17a is a schematic front view of a front face of an n-type silicon heterojunction-perovskite tandem cell shown in FIG. 3.
Figure 17B:
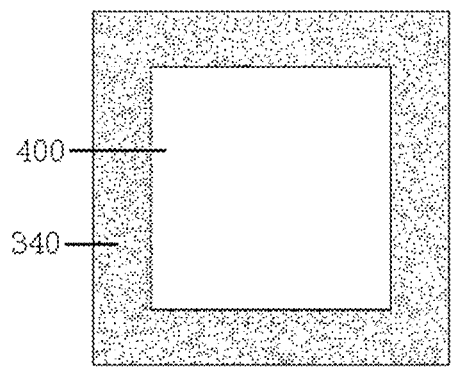
FIG. 17b is a front view of a back face of an n-type silicon heterojunction-perovskite tandem cell shown in FIG. 3.

As shown in FIG. 16, an electrode 400 is formed on the first transparent conducting layer 106 and the second transparent conducting layer 341 to collect current. In practical applications, grid lines of the electrode 400 may be fabricated by silk-screen printing or mask evaporating. A thickness of the electrode 400 may be from 100 nm to 500 nm, and the electrode 400 may be made of silver, copper, aluminum and other metals with good electrical conductivity. FIG. 17a is a schematic front view of an n-type silicon heterojunction-perovskite tandem cell shown; FIG. 17b is a front view of a back face of an n-type silicon heterojunction-perovskite tandem cell. As shown in FIG. 17a and FIG. 17b, the electrode 400 is formed on the first transparent conducting layer 106 and the second transparent conducting layer 341.

In order to verify performance of the tandem cell manufactured by the manufacturing method of the tandem cell according to the embodiment of the present disclosure, following description is made by comparing the embodiments and comparative embodiments with each other.

Embodiment 1

The manufacturing method of the n-type silicon heterojunction-perovskite tandem cell according to the embodiment of the present disclosure is specifically as follows.

In step 1, an n-type M2 silicon wafer with a resistivity of 4 Ω·cm and a thickness of 180 μm is provided. The silicon wafer is polished, textured and cleaned to form an n-type monocrystalline silicon substrate with a textured surface.

In step 2, an intrinsic amorphous silicon passivation layer (with a thickness of 5 nm) is deposited on both sides of the n-type monocrystalline silicon substrate by a PECVD device to form a first passivation layer on a front face of the n-type monocrystalline silicon substrate and a second passivation layer on a back face of the n-type monocrystalline silicon substrate.

In step 3, an n-type amorphous silicon layer (with a thickness of 10 nm) doped with phosphorus (with a doping concentration of $10^{20}$ cm$^{-3}$) is deposited on the first passivation layer by the PECVD device so as to form a front field structure.

In step 4, a p-type amorphous silicon layer (with a thickness of 10 nm) doped with boron (with a doping concentration of $10^{19}$ cm$^{-3}$) is deposited on the second passivation layer by the PECVD device so as to form a back field emitter.

In step 5, the first transparent conducting layer (with a thickness of 100 nm) made of ITO is prepared on the p-type amorphous silicon layer by the magnetron sputtering process.

In step 6, a passivation layer is formed on the n-type amorphous silicon layer by the magnetron sputtering process.

In step 7, a phosphorus-doped n-type heavily doped layer is formed on the passivation layer by the PECVD device.

In step 8, a hole transporting layer made of $AgGa_xO_2$ is prepared on the n-type heavily doped layer by magnetron sputtering. Three layers of composite hole transport material are prepared by using three kinds of $AgGa_xO_2$ targets with different compositions. Specifically, a first layer is made of a target with composition of $AgGa_{0.9}O_2$, a second layer is made of a target with composition of $AgGaO_2$ and a third layer is made of a target with composition of $AgGa_{1.1}O_2$. A thickness of each hole transporting layer is 5 nm, and a total thickness of the hole transporting layer is 15 nm.

In step 9, lead iodide and cesium bromide are formed on the hole transporting layer by co-evaporation, with a total thickness of 350 nm.

A mixed solution of FAI and FABr is prepared, with a molar concentration ratio of FAI and FABr of 3:1 and a solvent of ethanol. A 100 μL mixed solution of FAI and FABr is spin-coated on a layer of lead iodide and cesium bromide and react to form the perovskite material film.

At a temperature of 150° C., the perovskite thin film is annealed for 30 min, and a dense and uniform perovskite absorbing layer (with a thickness of 500 nm) is formed. A component of the absorption layer is $Cs_xFA_{1-x}Pb(Br_yI_{1-y})_3$.

In step 10, the LiF thin film layer (with a thickness of 1 nm) and a C60 thin film layer (with a thickness of 10 nm) are formed on the perovskite absorbing layer by thermal evaporation.

In step 11, the electron transporting layer (with a thickness of 10 nm) made of $SnO_2$ is fabricated by atomic layer deposition (ALD) process.

In step 12, a second transparent conducting layer (with a thickness of 100 nm) made of ITO is formed on the electron transporting layer by the magnetron sputtering process.

In step 13, silver electrode grid lines are formed on the first transparent conducting layer and the second transparent conducting layer by using a silk-screen printing process.

Embodiment 2

The manufacturing method of the n-type silicon heterojunction-perovskite tandem cell according to the embodiment of the present disclosure is specifically as follows.

In step 1, an n-type silicon wafer with a resistivity of 1 Ωcm and a thickness of 50 μm is provided. The silicon wafer is polished, textured and cleaned to form an n-type monocrystalline silicon substrate with a textured surface.

In step 2, an intrinsic amorphous silicon passivation layer (with a thickness of 1 nm) is deposited on both sides of the n-type monocrystalline silicon substrate by a PECVD device to form a first passivation layer on a front face of the n-type monocrystalline silicon substrate and a second passivation layer on a back face of the n-type monocrystalline silicon substrate.

In step 3, an n-type amorphous silicon layer (with a thickness of 1 nm) doped with phosphorus (with a doping concentration of $10^{20}$ cm$^{-3}$) is deposited on the first passivation layer by the PECVD device so as to form a front field structure.

In step 4, a p-type amorphous silicon layer (with a thickness of 1 nm) doped with boron (with a doping concentration of $10^{19}$ cm$^{-3}$) is deposited on the second passivation layer by the PECVD device so as to form a back field emitter.

In step 5, the first transparent conducting layer (with a thickness of 30 nm) made of ITO is prepared on the p-type amorphous silicon layer by the magnetron sputtering process.

In step 6, a passivation layer is formed on the n-type amorphous silicon layer by the magnetron sputtering process.

In step 7, a phosphorus-doped n-type heavily doped layer is formed on the passivation layer by the PECVD device.

In step 8, a hole transporting layer made of $AgCr_xO_2$ is prepared on the n-type heavily doped layer by a laser pulse deposition process. Three layers of composite hole transport material are prepared by using three kinds of $AgCr_xO_2$ targets with different compositions. Specifically, a first layer is made of a target with composition of $AgCr_{0.95}O_2$, a second layer is made of a target with composition of $AgCrO_2$ and a third layer is made of a target with composition of $AgCr_{1.05}O_2$. A thickness of each hole transporting layer is 5 nm, and a total thickness of the hole transporting layer is 15 nm. In a direction away from the bottom cell, the valence band top energy level of the hole transporting layer sequentially decreases, with a variation range of the valence band top energy level from −4.5 eV to −5.4 eV.

In step 9, lead iodide and cesium bromide are formed on the hole transporting layer by co-evaporation, with a total thickness of 250 nm.

A mixed solution of FAI and FABr is prepared, with a molar concentration ratio of FAI and FABr of 2:1 and a solvent of ethanol. A 100 μL mixed solution of FAI and FABr is spin-coated on a layer of lead iodide and cesium bromide and react to form the perovskite material film.

At a temperature of 100° C., the perovskite thin film is annealed for 5 min, and a dense and uniform perovskite absorbing layer (with a thickness of 100 nm) is formed. A component of the absorption layer is $Cs_xFA_{1-x}Pb(Br_yI_{1-y})_3$.

In step 10, the LiF thin film layer (with a thickness of 0.1 nm) and a C60 thin film layer (with a thickness of 1 nm) are formed on the perovskite absorbing layer by thermal evaporation.

In step 11, the electron transporting layer (with a thickness of 1 nm) made of $SnO_2$ is fabricated by atomic layer deposition (ALD) process.

In step 12, a second transparent conducting layer made of ITO (with a thickness of 30 nm) is formed on the electron transporting layer by the magnetron sputtering process.

In step 13, silver electrode grid lines are formed on the first transparent conducting layer and the second transparent conducting layer by using a silk-screen printing process.

Embodiment 3

The manufacturing method of the n-type silicon heterojunction-perovskite tandem cell according to the embodiment of the present disclosure is specifically as follows.

In step 1, an n-type silicon wafer with a resistivity of 10 Ωcm and a thickness of 200 μm is provided. The silicon wafer is polished, textured and cleaned to form an n-type monocrystalline silicon substrate with a textured surface.

In step 2, an intrinsic amorphous silicon passivation layer (with a thickness of 20 nm) is deposited on both sides of the n-type monocrystalline silicon substrate by PECVD device to form a first passivation layer on a front face of the n-type monocrystalline silicon substrate and a second passivation layer on a back face of the n-type monocrystalline silicon substrate.

In step 3, an n-type amorphous silicon layer (with a thickness of 30 nm) doped with phosphorus (with a doping concentration of $10^{20}$ cm$^{-3}$) is deposited on the first passivation layer by the PECVD device so as to form a front field structure.

In step 4, a p-type amorphous silicon layer (with a thickness of 30 nm) doped with boron (with a doping concentration of $10^{19}$ cm$^{-3}$) is deposited on the second passivation layer by the PECVD device so as to form a back field emitter.

In step 5, the first transparent conducting layer (with a thickness of 120 nm) made of ITO is prepared on the p-type amorphous silicon layer by the magnetron sputtering process.

In step 6, a passivation layer is formed on the n-type amorphous silicon layer by the magnetron sputtering process.

In step 7, a phosphorus-doped n-type heavily doped layer is formed on the passivation layer by the PECVD device.

In step 8, a hole transporting layer made of AgGa$_x$O$_2$ is prepared on the n-type heavily doped layer by a laser pulse deposition process. Three layers of composite hole transport material are prepared by using three kinds of AgGa$_x$O$_2$ targets with different compositions. Specifically, a first layer is made of a target with composition of AgGa$_{0.95}$O$_2$, a second layer is made of a target with composition of AgGaO$_2$ and a third layer is made of a target with composition of AgGa$_{1.05}$O$_2$. A thickness of each hole transporting layer is 25 nm, and a total thickness of the hole transporting layer is 75 nm. In a direction away from the bottom cell, the valence band top energy level of the hole transporting layer sequentially decreases, with a variation range of the valence band top energy level from −4.5 eV to −5.4 eV.

In step 9, lead iodide and cesium bromide are formed on the hole transporting layer by co-evaporation, with a total thickness of 1000 nm.

A mixed solution of FAI and FABr is prepared, with a molar concentration ratio of FAI and FABr of 4:1 and a solvent of ethanol. A 100 μL mixed solution of FAI and FABr is spin-coated on a layer of lead iodide and cesium bromide and react to form the perovskite material film.

At a temperature of 200° C., the perovskite thin film is annealed for 30 min, and a dense and uniform perovskite absorbing layer (with a thickness of 1000 nm) is formed. A component of the absorption layer is Cs$_x$FA$_{1-x}$Pb(Br$_y$I$_{1-y}$)$_3$.

In step 10, the LiF thin film layer (with a thickness of 10 nm) and a C60 thin film layer (with a thickness of 20 nm) are formed on the perovskite absorbing layer by thermal evaporation.

In step 11, the electron transporting layer (with a thickness of 30 nm) made of SnO$_2$ is fabricated by atomic layer deposition (ALD) process.

In step 12, a second transparent conducting layer (with a thickness of 120 nm) made of ITO is formed on the electron transporting layer by the magnetron sputtering process.

In step 13, silver electrode grid lines are formed on the first transparent conducting layer and the second transparent conducting layer by using a silk-screen printing process.

Comparative Embodiment 1

A manufacturing method of a tandem cell according to this comparative example is basically the same as that described in the Embodiment 1 above, with only difference that the hole transporting layer is made of Spiro-TTB, and a manufacturing process of the hole transporting layer is a thermal evaporation process. The valence band top energy level is the same everywhere in the hole transporting layer, and there is a p-type heavily doped layer between the passivation layer and the hole transporting layer.

Comparative Embodiment 2

A manufacturing method of a tandem cell according to this comparative example is basically the same as that described in the Embodiment 1 above, with only difference that the hole transporting layer is made of nickel oxide. The valence band top energy level is the same everywhere in the hole transporting layer, and there is a p-type heavily doped layer between the passivation layer and the hole transporting layer.

In order to verify performance of the tandem cell, scanning electron microscope (SEM) and I-V tests are performed on devices prepared in Embodiment 1, Comparative Embodiment 1 and Comparative Embodiment 2, and performance parameters such as a photoelectric conversion efficiency, a filling factor, an open-circuit voltage and a short-circuit current of the devices are compared (Table 1).

Figure 18:
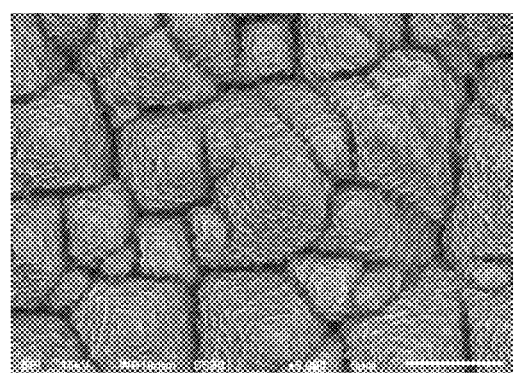
FIG. 18 is a SEM image of a surface morphology of the tandem cell prepared in Embodiment 1 of the present disclosure.
Figure 19:
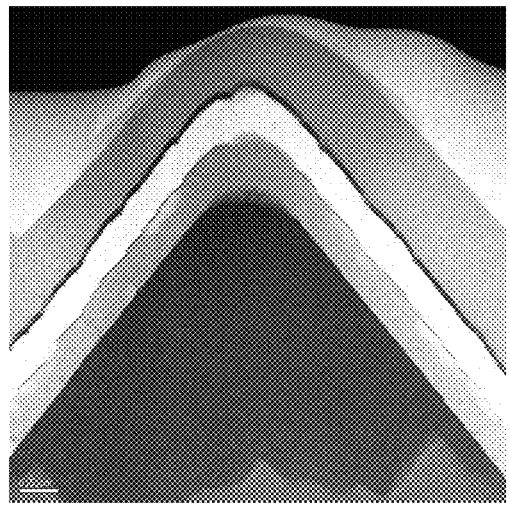
FIG. 19 is a cross-sectional SEM image of the tandem cell prepared in Embodiment 1 of the present disclosure.

FIG. 18 shows a SEM image of surface morphology of the tandem cell prepared in Embodiment 1. FIG. 19 shows a SEM image of a cross section of the tandem cell prepared in Embodiment 1. As can be seen from FIG. 18, a surface of the tandem cell prepared in Embodiment 1 is a pyramid textured surface. It can be seen from FIG. 19 that a lower surface of the perovskite absorbing layer is closely attached to the hole transporting layer, and no defect at a tip of the pyramid or accumulation at valleys between pyramids is observed. In addition, no interfacial void and peeling phenomenon were observed in the perovskite absorbing layer, and the perovskite thin film grew evenly, and no obvious grain boundary defects are observed, which indicates that crystallinity of the perovskite absorbing layer is high. It can be seen that functional layers of the top cell of the tandem cell prepared in Embodiment 1 may be distributed along the pyramid textured surface of the bottom cell, and interface contact between the hole transporting layer and the perovskite absorbing layer is good, and film forming quality of the perovskite absorbing layer is good.

Figure 20:
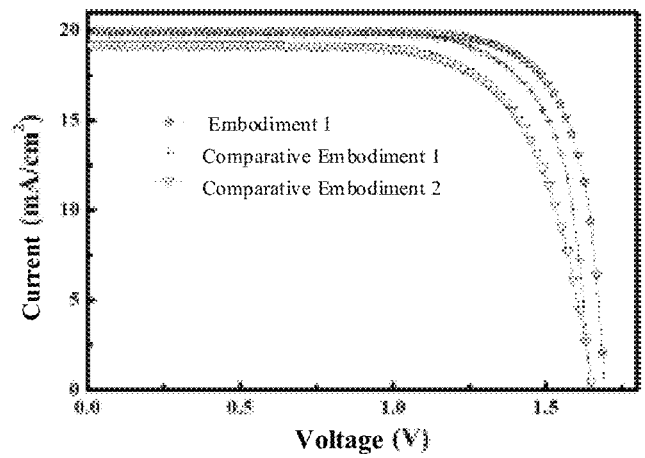
FIG. 20 is an I-V curve of the tandem cells prepared in Embodiment 1, Comparative Embodiment 1 and Comparative Embodiment 2 of the present disclosure.
Figure 21:
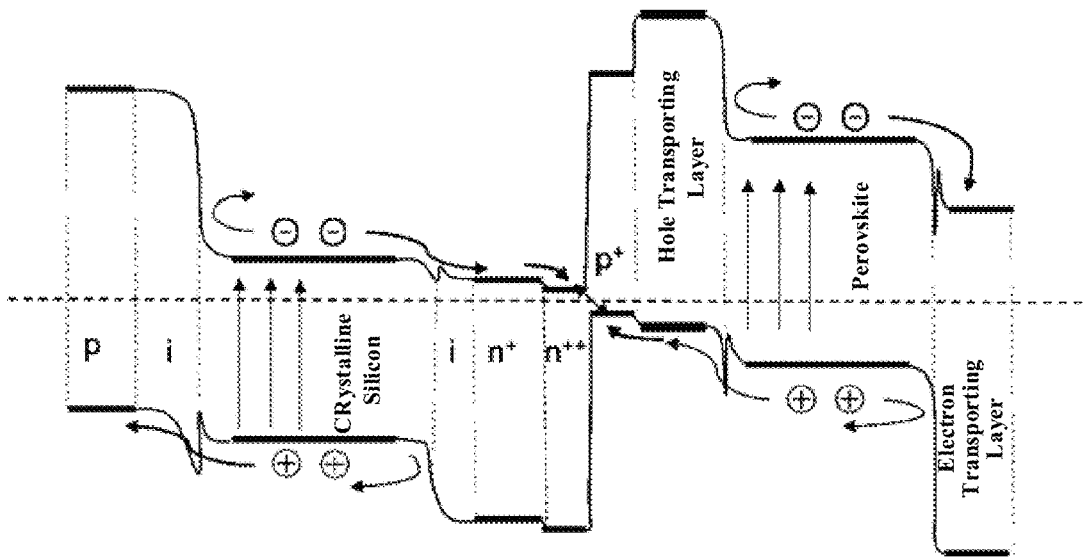
FIG. 21 is a schematic diagram of energy bands of tandem cells according to Comparative Embodiments 1 and 2.
Figure 22:
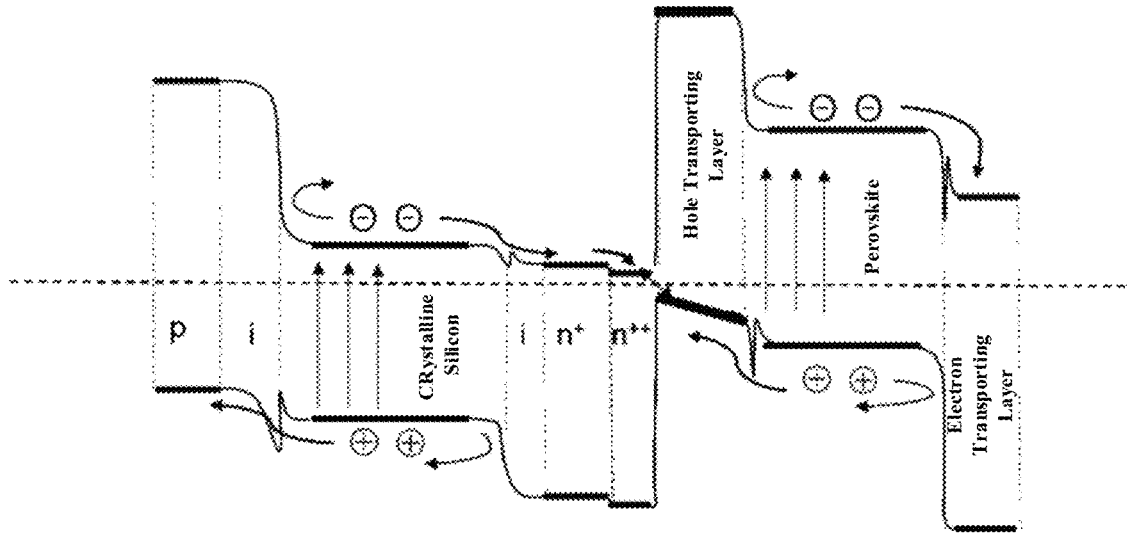
FIG. 22 is a schematic diagram of an energy band of a tandem cell according to an embodiment of the present disclosure.

FIG. 20 shows I-V curves of the tandem cells prepared in Embodiment 1, Comparative Embodiment 1 and Comparative Embodiment 2 under irradiation of AM1.5G solar intensity. As can be seen from FIG. 20, a short-circuit current J$_{sc}$ of the tandem cell prepared in Embodiment 1 is 20.2 mA/cm$^2$, an open-circuit voltage V$_{oc}$ is 1.69 V, a filling factor FF is 77%, and a final cell conversion efficiency is 26.3%. FIG. 21 is a schematic diagram showing energy bands of tandem cells according to Comparative Embodiments 1 and 2. FIG. 22 is a schematic diagram showing energy bands of the tandem cells of Embodiments 1 to 3. Comparing FIG. 21 with FIG. 22, it can be seen that the hole transporting layer with the sequentially decreasing valence band top energy level is used to replace the p-type heavily doped layer (with the p-type heavily doped layer omitted), the valence band top energy level of the hole transporting layer is close to a valence band energy level of the perovskite absorbing layer, and the conduction band low energy level of the hole transporting layer is close to a conduction band energy level of the n-type heavily doped layer, so that a contact barrier is small, a hole transport efficiency may be improved, and a carrier recombination efficiency is high.

The device performance parameters of the tandem cell prepared in Embodiment 1 are obviously superior to those of traditional tandem cells. Table 1 shows performance parameters of tandem cells prepared in various embodiments and comparative embodiments.

TABLE 1

Comparison table of performance parameters of different tandem cells

| Number | Effective Area ($cm^2$) | $V_{OC}$ (V) | $J_{SC}$ ($mA/cm^2$) | FF | Photoelectric Conversion Efficiency |
|---|---|---|---|---|---|
| Embodiment 1 | 1.21 | 1.69 | 20.2 | 0.77 | 26.3% |
| Embodiment 2 | 1.21 | 1.62 | 19.3 | 0.78 | 24.4% |
| Embodiment 3 | 1.21 | 1.67 | 20.2 | 0.76 | 26.2% |
| Comparative Embodiment 1 | 1.21 | 1.64 | 19.9 | 0.75 | 24.5% |
| Comparative Embodiment 2 | 1.21 | 1.65 | 19.2 | 0.70 | 22.2% |

As can be seen from FIG. 20 and Table 1, a short-circuit current $J_{sc}$ of the tandem cell prepared in Embodiment 1 is 20.2 $mA/cm^2$, an open-circuit voltage $V_{oc}$ is 1.69 V, a filling factor FF is 77%, and a final cell conversion efficiency is 26.3%. The device performance parameters of the tandem cell prepared in Embodiment 1 are obviously superior to those of traditional tandem cells in Comparative Embodiment 1 and Comparative Embodiment 2. Compared with Embodiment 1 and Embodiment 2, it can be seen that the filling factor of the tandem cell may be finely adjusted by adjusting a material of the hole transporting layer. By comparing Embodiment 1 and Embodiment 3, it can be seen that better performance of a tandem cell may be obtained by using different vacuum deposition processes.

Although this application is described here by combining the embodiments, in the course of carrying out the application for the protection required, a person skilled in the art can understand and realize other changes in the disclosed embodiment by looking at the drawings, the disclosed contents and the claims. In a claim, the term "comprising" does not exclude other components or steps, and "a" or "an" does not exclude multiple situations. Different dependent claims contain certain measures, but this does not mean that these measures cannot be combined to produce good effects.

Although this application is described by combining the specific features and embodiments, it is clear that it can be modified and combined without departing from the spirit and scope of this application. Accordingly, this specification and the drawings are only an illustrative description of the application as defined by the claims, and are deemed to cover any and all modifications, changes, combinations or equivalents within the scope of this application. Obviously, a person skilled in the art can make various changes and variants to this application without deviating from the spirit and scope of this application. In this way, if these modifications and variants of this application fall within the scope of the claim and its equivalent technology, this application also intends to include these modifications and variants.

The invention claimed is:

1. A tandem cell, comprising:
   a bottom cell;
   a hole transporting layer formed on the bottom cell, a material of the hole transporting layer comprising a semiconductor material with a p-type delafossite structure, and a valence band top energy level of the hole transporting layer sequentially decreasing in a direction away from the bottom cell;
   a perovskite absorbing layer formed on the hole transporting layer; and
   a transparent conducting layer formed above the perovskite absorbing layer.

2. The tandem cell according to claim 1, wherein a general chemical formula of the semiconductor material with the p-type delafossite structure is $ABC_x$, wherein A comprises one or more of $Cu^+$, $Ag^+$, $Pd^+$, $Sr^+$ and $Pt^+$, and B comprises one or more of $B^{3+}$, $Al^{3+}$, $Ga^{3+}$, $In^{3+}$, $Cr^{3+}$, $Fe^{3+}$, $Sc^{3+}$ and trivalent rare earth cations; C is an oxygen group element, comprising one or more of O, S, Se and Te; and x ranges from 1.95 to 2.6.

3. The tandem cell according to claim 2, wherein the hole transporting layer has a plurality of sublayers in a thickness direction, contents of the component B in the sublayers increase sequentially in a direction from a layer further from the perovskite absorbing layer to a layer closer to the perovskite absorbing layer.

4. The tandem cell according to claim 1, wherein a thickness of the hole transporting layer is from 5 nm to 100 nm; and/or,
   the valence band top energy level of the hole transporting layer ranges from −4.5 eV to −5.4 eV.

5. The tandem cell according to claim 1, wherein an n-type heavily doped layer is on top of the bottom cell, and the n-type heavily doped layer contacts with the hole transporting layer to form a carrier recombination interface.

6. The tandem cell according to claim 5, wherein the tandem cell further comprises a passivation layer between the bottom cell and the n-type heavily doped layer.

7. The tandem cell according to claim 1, wherein the bottom cell is any one of a crystalline silicon bottom cell, a polycrystalline silicon bottom cell, an ingot monocrystalline silicon bottom cell, a copper indium gallium selenide bottom cell, a perovskite bottom cell, a gallium arsenide bottom cell and an organic photovoltaic bottom cell.

8. The tandem cell according to claim 1, wherein a general chemical formula of the semiconductor material with the p-type delafossite structure is $AB_aC_x$, wherein A comprises one or more of $Cu^+$, $Ag^+$, $Pd^+$, $Sr^+$ and $Pt^+$, and B comprises one or more of $B^{3+}$, $Al^{3+}$, $Ga^{3+}$, $In^{3+}$, $Cr^{3+}$, $Fe^{3+}$, $Sc^{3+}$ and trivalent rare earth cations; C is an oxygen group element, comprising one or more of O, S, Se and Te; x ranges from 1.95 to 2.6; and a ranges from 0.9 to 1.1.

9. The tandem cell according to claim 8, wherein a content of the component B in the hole transporting layer increases sequentially in a direction from a part of the hole transporting layer further from the perovskite absorbing layer to a part of the hole transporting layer closer to the perovskite absorbing layer.

10. A method for manufacturing the tandem cell according to claim 1, comprising:
    providing the bottom cell;
    forming the hole transporting layer on the bottom cell by a vacuum deposition process, a material of the hole transporting layer comprising the semiconductor material with the p-type delafossite structure, and the valence band top energy level of the hole transporting layer sequentially decreasing in the direction away from the bottom cell;
    forming the perovskite absorbing layer on the hole transporting layer; and
    forming an electron transporting layer and the transparent conducting layer on the perovskite absorbing layer.

11. The method for manufacturing the tandem cell according to claim 10, wherein the vacuum deposition process is a magnetron sputtering process, a laser pulse deposition process or a thermal evaporation coating process.

12. The method for manufacturing the tandem cell according to claim 10, wherein the step of forming the perovskite absorbing layer on the hole transporting layer comprises:

forming lead iodide and cesium bromide on the hole transporting layer by co-evaporation;

coating a mixed solution of formamidine hydroiodide and formamidine hydrobromide on the lead iodide and cesium bromide to form a perovskite film; and annealing the perovskite film to form the perovskite absorbing layer.

\* \* \* \* \*